United States Patent
Hong et al.

(10) Patent No.: US 9,385,248 B2
(45) Date of Patent: *Jul. 5, 2016

(54) SOLAR CELL PANEL

(75) Inventors: Jongkyoung Hong, Seoul (KR);
Jongdae Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 12/947,517

(22) Filed: Nov. 16, 2010

(65) Prior Publication Data
US 2011/0139210 A1 Jun. 16, 2011

(30) Foreign Application Priority Data
Aug. 17, 2010 (KR) .................. 10-2010-0079240

(51) Int. Cl.
*H01L 31/044* (2014.01)
*H01L 31/0224* (2006.01)
*H01L 31/05* (2014.01)

(52) U.S. Cl.
CPC ...... *H01L 31/022433* (2013.01); *H01L 31/022425* (2013.01); *H01L 31/0512* (2013.01); *Y02E 10/50* (2013.01)

(58) Field of Classification Search
CPC .............. H01L 31/022425; H01L 31/022433; H01L 31/00–31/078; Y02E 10/547; Y02E 10/50–10/60
USPC ................................. 136/243–265
See application file for complete search history.

(56) References Cited

U.S. PATENT DOCUMENTS

| 4,542,258 | A  | * | 9/1985  | Francis et al.  | 136/256 |
|-----------|----|---|---------|-----------------|---------|
| 5,084,107 | A  | * | 1/1992  | Deguchi et al.  | 136/256 |
| 5,178,685 | A  | * | 1/1993  | Borenstein et al. | 136/244 |
| 2007/0079862 | A1 | * | 4/2007  | Kawagoe et al. | 136/244 |
| 2007/0095387 | A1 | * | 5/2007  | Fujii et al.   | 136/251 |
| 2007/0186968 | A1 | * | 8/2007  | Nakauchi et al. | 136/244 |
| 2007/0235077 | A1 | * | 10/2007 | Nagata et al.  | 136/256 |
| 2008/0000519 | A1 | * | 1/2008  | Takahashi      | 136/252 |
| 2008/0121265 | A1 | * | 5/2008  | Hishida et al. | 136/244 |
| 2008/0169020 | A1 | * | 7/2008  | Shiomi et al.  | 136/252 |
| 2008/0196757 | A1 |   | 8/2008  | Yoshimine      |         |
| 2009/0266399 | A1 | * | 10/2009 | Basol et al.   | 136/244 |
| 2009/0288697 | A1 | * | 11/2009 | Shimizu        | H05K 3/323 |
|           |    |   |         |                | 136/244 |

(Continued)

FOREIGN PATENT DOCUMENTS

| CN | 101499494 A | 8/2009 |
| CN | 101720512 A | 6/2010 |
| EP | 1119007 A2  | 7/2001 |

(Continued)

*Primary Examiner* — Bach Dinh
(74) *Attorney, Agent, or Firm* — Birch, Stewart, Kolasch & Birch, LLP

(57) ABSTRACT

A solar cell panel is discussed. The solar cell panel includes a plurality of solar cells, each solar cell including a substrate and a plurality of back electrodes that are positioned on a back surface of the substrate that is opposite a light receiving surface, the plurality of back electrodes being spaced apart from one another by a space to expose the substrate, a conductive adhesive film including a resin and a plurality of conductive particles dispersed in the resin, and an interconnector positioned on a back surface of the conductive adhesive film that is opposite a surface that contacts the substrate. The conductive adhesive film is positioned on the back surface of the substrate that is exposed through the space. The interconnector directly contacts the conductive adhesive film.

19 Claims, 16 Drawing Sheets

(56) References Cited

U.S. PATENT DOCUMENTS

2009/0325327 A1 12/2009 Rohatgi et al.
2010/0147355 A1 6/2010 Shimizu et al.

FOREIGN PATENT DOCUMENTS

| EP | 1928027 A2 | 6/2008 |
|----|------------|--------|
| EP | 2086022 A1 | 8/2009 |
| EP | 2086023 A1 | 8/2009 |
| EP | 2136407 A2 | 12/2009 |
| JP | 7-147424 A | 6/1995 |
| JP | 2006-206843 A | 8/2006 |
| KR | 10-2009-0073218 A | 7/2009 |
| KR | 10-2010-0011943 A | 2/2010 |
| WO | WO 2008/137174 A | 11/2008 |
| WO | WO 2009/075189 A1 | 6/2009 |
| WO | WO 2009/157079 A1 | 12/2009 |

* cited by examiner

SOLAR CELL PANEL

This application claims priority to and the benefit of Korean Patent Application No. 10-2010-0079240 filed in the Korean Intellectual Property Office on Aug. 17, 2010, the entire contents of which are incorporated herein by reference.

BACKGROUND OF THE INVENTION

1. Field of the Invention

Example embodiments of the invention relate to a solar cell panel in which adjacent solar cells are electrically connected to one another using an interconnector.

2. Description of the Related Art

Solar power generation to convert light energy into electric energy using a photoelectric transformation effect has been widely used as a method for obtaining eco-friendly energy. A solar power generation system using a plurality of solar cell panels has been installed in places, such as houses due to an improvement in a photoelectric transformation efficiency of solar cells.

The solar cell panel includes an interconnector for electrically connecting a plurality of solar cells to one another, front and back protective members for protecting the solar cells, and a sealing member that is positioned between the front and back protective members to seal the solar cells.

SUMMARY OF THE INVENTION

In one aspect, there is a solar cell panel including a plurality of solar cells, an interconnector electrically connecting the plurality of solar cells to one another, and a conductive adhesive film positioned between the interconnector and a substrate of each solar cell. Each of the plurality of solar cells includes a substrate and a plurality of back electrodes that are positioned on a back surface of the substrate that is opposite a light receiving surface to be spaced apart from one another at a space to expose the substrate. The conductive adhesive film includes a resin and a plurality of conductive particles dispersed in the resin. The conductive adhesive film is positioned on the back surface of the substrate that is exposed through the space. The conductive adhesive film may directly contact the back surface of the substrate. The interconnector is positioned on a back surface of the conductive adhesive film that is opposite a surface that contacts the substrate and directly contacts the conductive adhesive film.

A thickness of the interconnector may vary based on a width direction. For example, one surface of the interconnector may be a flat surface, and a surface opposite the flat surface may be a nonuniform surface protruding in a direction far or way from the flat surface.

The nonuniform surface of the interconnector may be a curved surface. Further, the nonuniform surface of the interconnector may be formed using a curved surface and a flat surface or using a flat surface and an inclined surface.

The interconnector having the above-described structure is positioned on the back surface of the conductive adhesive film in a state where the conductive adhesive film is applied and pressed in a space between the back electrodes, and then a tabbing process is performed using tabbing equipment. In this instance, the tabbing process may be accurately performed irrespective of a width of a tab of the tabbing equipment, the space between the back electrodes, and the thickness of the back electrodes.

Each of the plurality of solar cells further includes a back surface field layer between the plurality of back electrodes and the substrate. The back surface field layer is positioned at the back surface of the substrate. The back surface field layer is formed in the same pattern as the back electrode. The back surface field layer may be formed in an area of the back surface of the substrate at which the plurality of back electrodes are positioned, and in an area of the back surface of the substrate at which the space is positioned.

The conductive adhesive film and at least one back electrode may have substantially the same thickness or may have different thicknesses.

The interconnector and the space have substantially the same width or may have different widths.

The plurality of conductive particles may directly contact at least one of the substrate and the interconnector. The resin may be positioned between the plurality of conductive particles and the substrate, and between the plurality of conductive particles and the interconnector.

The plurality of conductive particles may be electrically connected to one another. Accordingly, a current may smoothly flow when carriers moving to the back surface of the substrate moves through the conductive particles.

The plurality of conductive particles may directly contact at least one of the substrate and the interconnector, so as to efficiently transfer carriers moving to the back surface of the substrate to the interconnector. Preferably, but not required, the plurality of conductive particles may directly contact each of the substrate and the interconnector.

Each of the plurality of solar cells may further include an emitter layer positioned on a light receiving surface of the substrate, a front electrode electrically connected to the emitter layer, and an anti-reflection layer positioned on the emitter layer at a portion on which the front electrode is not positioned. Each of the plurality of solar cells may further include a front electrode current collector positioned on the emitter layer in a direction crossing the front electrode.

A conductive adhesive film is positioned on a front surface of the front electrode. The interconnector electrically connected to the back surface of the substrate of the adjacent solar cell is positioned on a front surface of the conductive adhesive film.

The front electrode includes a first portion directly contacting the conductive adhesive film and a second portion not contacting the conductive adhesive film.

The first and second portions of each of the plurality of front electrodes may have the same width. The first and second portions of at least one of the plurality of front electrodes may have different widths.

When a width of the first portion is different from a width of the second portion, the width of the first portion may be greater than the width of the second portion. Hence, an adhesive strength between the conductive adhesive film and the front electrode is improved, and a contact resistance between the conductive adhesive film and the front electrode decreases. As a result, an output reduction thereof is prevented or reduced.

The first portion has a predetermined length in a longitudinal direction of the front electrode, and the length of the first portion may be equal to or less than a width of the conductive adhesive film.

A portion of the conductive adhesive film directly contacts the anti-reflection layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
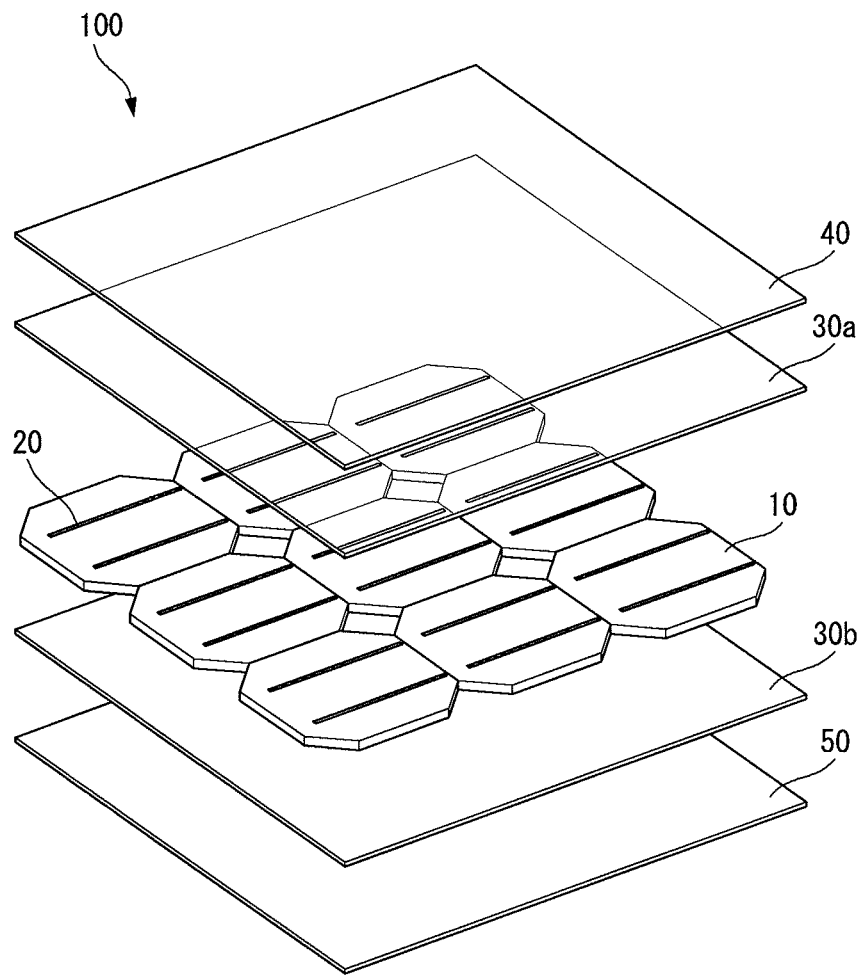
FIG. 1 is an exploded perspective view of a solar cell panel according to an embodiment of the invention.

The invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 2:
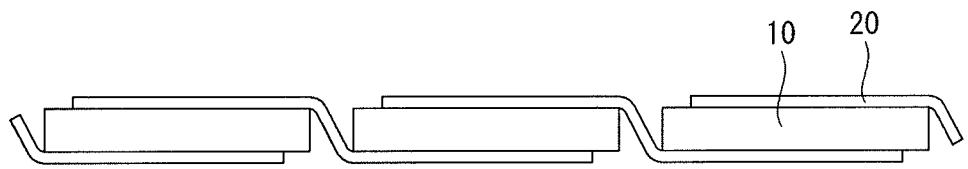
FIG. 2 schematically illustrates an electrical connection structure between a plurality of solar cells of a solar cell panel.

FIG. 1 is an exploded perspective view of a solar cell panel according to an embodiment of the invention. FIG. 2 schematically illustrates an electrical connection structure between a plurality of solar cells of the solar cell panel.

As shown in FIGS. 1 and 2, a solar cell panel 100 according to an example embodiment of the invention includes a plurality of solar cells 10, interconnectors 20 for electrically connecting the solar cells 10 to one another, front and back protective layers 30a and 30b for protecting the solar cells 10, a transparent member 40 positioned on the front protective layer 30a on light receiving surfaces of the solar cells 10, and a back sheet 50 underlying the back protective layer 30b on surfaces opposite the light receiving surfaces of the solar cells 10.

The back sheet 50 prevents moisture or oxygen from penetrating into a back surface of the solar cell panel 100, thereby protecting the solar cells 10 from an external environment. The back sheet 50 may have a multi-layered structure including a moisture/oxygen penetrating prevention layer, a chemical corrosion prevention layer, a layer having insulating characteristics, etc.

In a double-sided light receiving solar cell, a glass or a resin having a light transparency may be used instead of the back sheet 50.

The front and back protective layers 30a and 30b and the solar cells 10 form an integral body when a lamination process is performed in a state where the front and back protective layers 30a and 30b are respectively positioned on front surfaces and back surfaces of the solar cells 10. The front and back protective layers 30a and 30b prevent corrosion of metal resulting from the moisture penetration and protect the solar cells 10 from an impact. The front and back protective layers 30a and 30b may be formed of a material such as ethylene vinyl acetate (EVA). Other materials may be used.

The transparent member 40 on the front protective layer 30a is formed of a tempered glass having a high light transmittance and excellent damage prevention characteristic. The tempered glass may be a low iron tempered glass containing a small amount of iron. The transparent member 40 may have an embossed inner surface so as to increase a scattering effect of light.

As shown in FIG. 1, the plurality of solar cells 10 is arranged in a matrix structure. Although FIG. 1 illustrates that the solar cells 10 on the back protective layer 30b have a structure of a 3×3 matrix, the number of solar cells 10 in row and/or column directions may vary, if necessary or desired.

As shown in FIG. 2, the plurality of solar cells 10 are electrically connected to one another using the interconnectors 20. More specifically, an electrode part formed on a front surface of one solar cell 10 is electrically connected to an electrode part formed on a back surface of another solar cell 10 adjacent to the one solar cell 10 using an interconnector 20 in a state where the plurality of solar cells 10 are positioned adjacently to one another.

A solar cell in a solar cell panel according to a first example embodiment of the invention is described below with reference to FIGS. 3 to 13.

Figure 3:
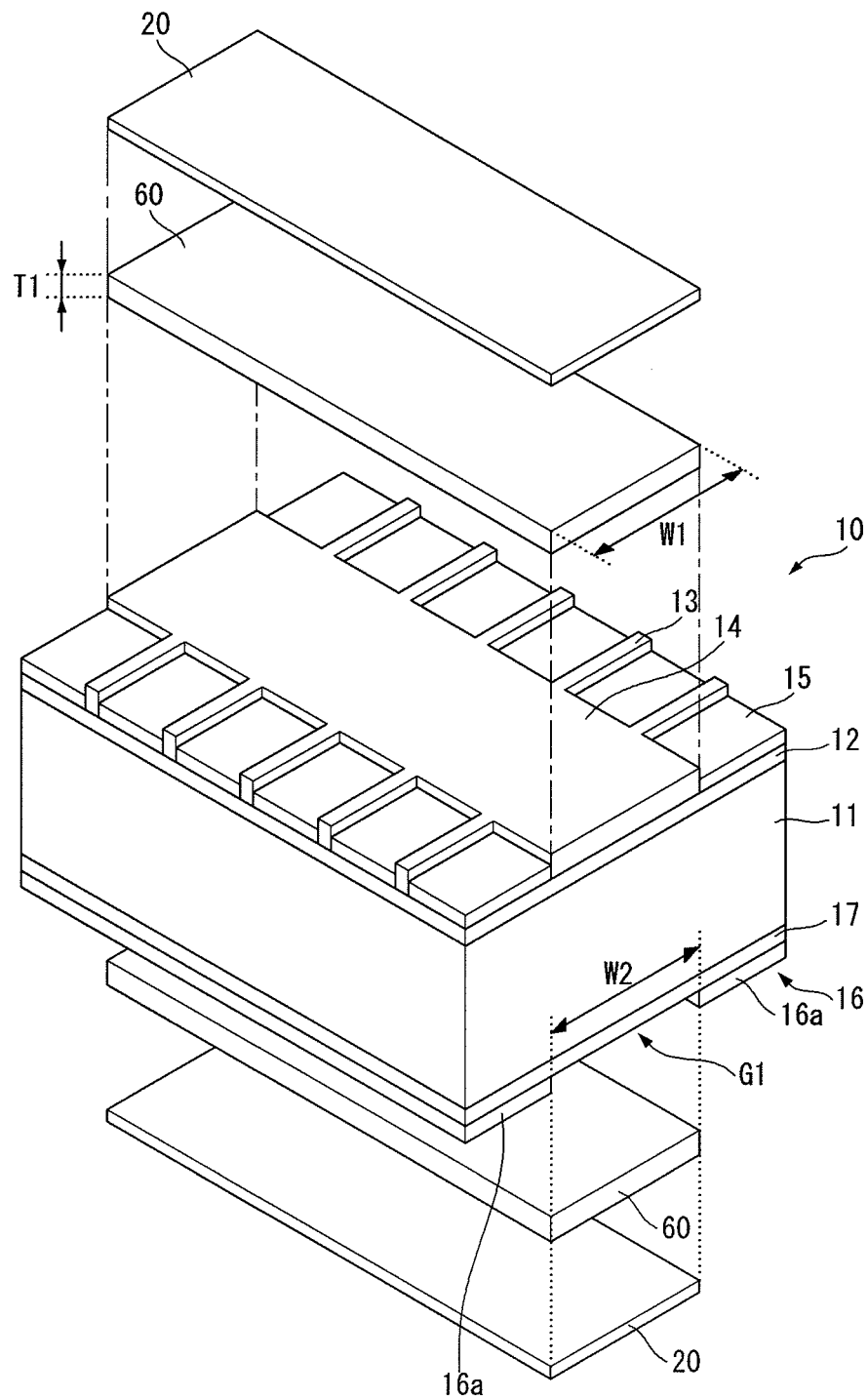
FIG. 3 is an exploded perspective view illustrating a configuration of a solar cell in a solar cell panel according to a first example embodiment of the invention.
Figure 4:
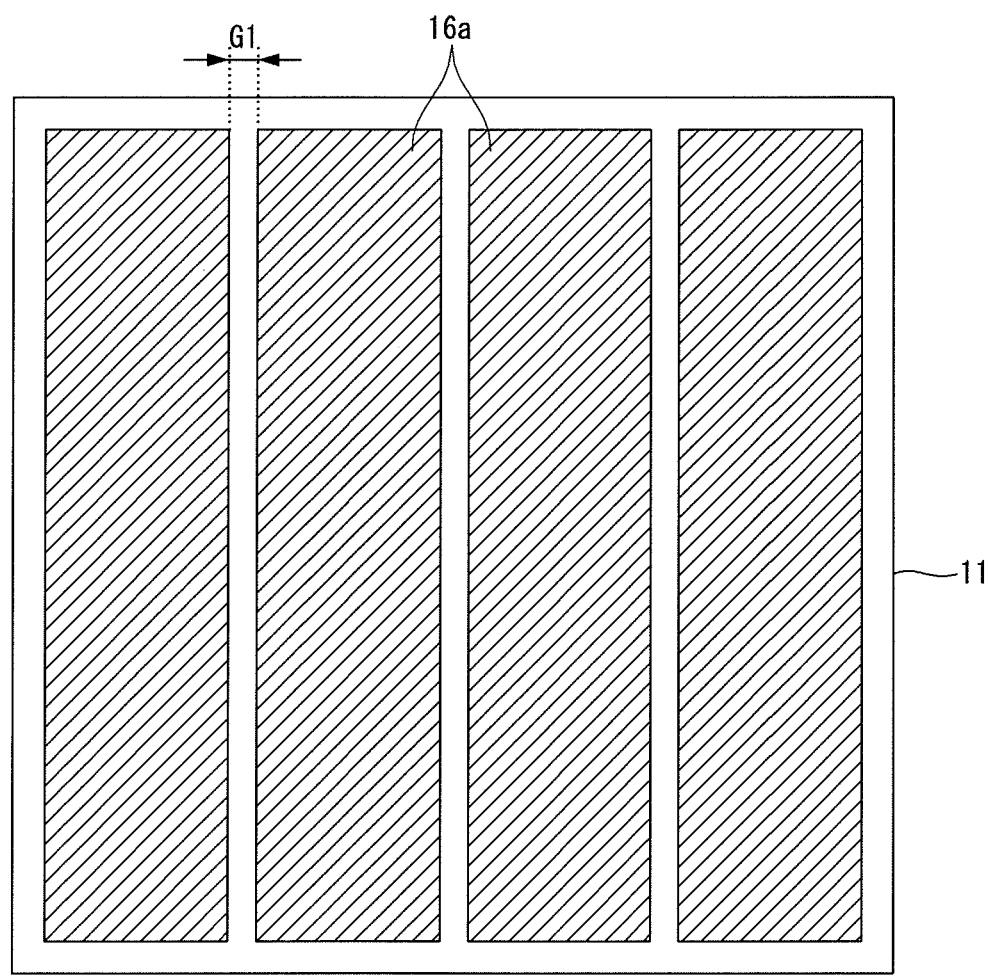
FIG. 4 is a plane view of a back surface of a substrate of the solar cell and illustrating a configuration of a back electrode.
Figure 11:
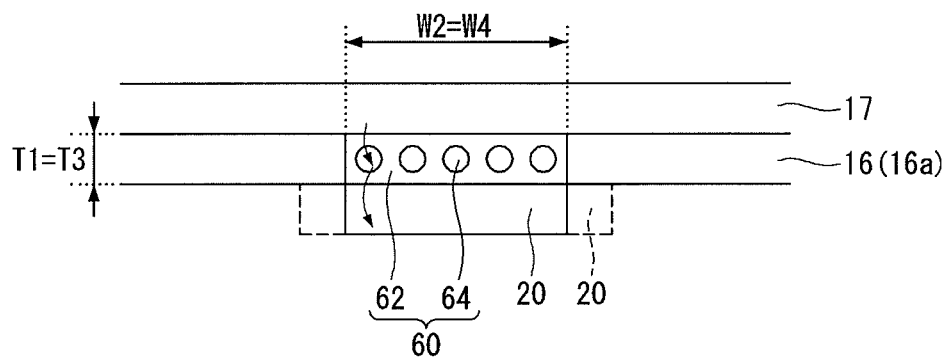
FIGS. 11 to 13 are cross-sectional views illustrating various assembly configurations of a back surface of a substrate of the solar cell in the solar cell panel shown in FIG. 3.
Figure 12:
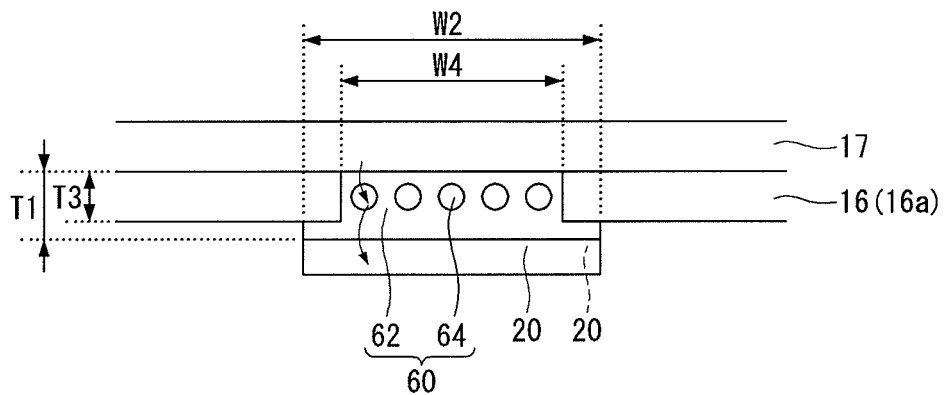
Figure 13:
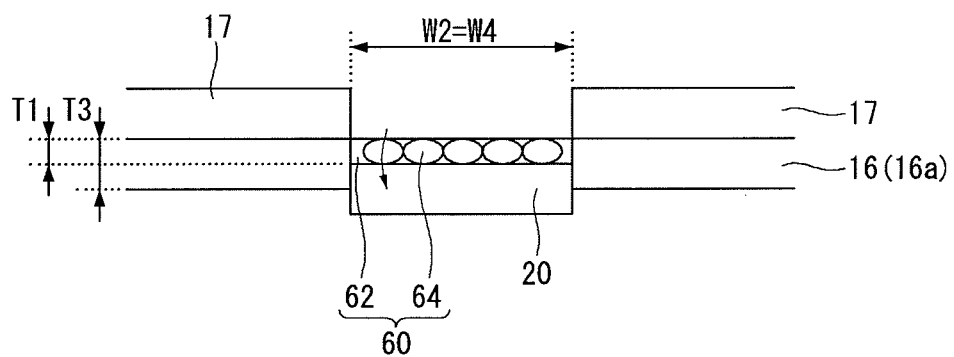

FIG. 3 is an exploded perspective view illustrating a configuration of a solar cell in a solar cell panel according to a first example embodiment of the invention. FIG. 4 is a plane view of a back surface of a substrate of the solar cell and illustrating a configuration of a back electrode. FIGS. 5 to 10 are cross-sectional views illustrating various assembly configurations of a front surface of a substrate of the solar cell in the solar cell panel shown in FIG. 3. FIGS. 11 to 13 are cross-sectional views illustrating various assembly configurations of a back surface of a substrate of the solar cell in the solar cell panel shown in FIG. 3.

As shown in FIG. 3, the solar cell 10 includes a substrate 11, an emitter layer 12 positioned at a front surface (for example, a light receiving surface on which light is incident)

of the substrate 11, a plurality of front electrodes 13 positioned on the emitter layer 12, a front electrode current collector 14 that is positioned on the emitter layer 12 to cross the front electrodes 13, an anti-reflection layer 15 positioned on the emitter layer 12 on which the front electrodes 13 and the front electrode current collector 14 are not positioned, and a back electrode 16 positioned on a surface (i.e., a back surface) opposite the light receiving surface of the substrate 11.

The solar cell 10 further includes a back surface field (BSF) layer 17 between the back electrode 16 and the substrate 11. The back surface field layer 17 is a region (e.g., a $p^+$-type region) that is more heavily doped with impurities of the same conductive type as the substrate 11 than the substrate 11. The back surface field layer 17 is positioned at the back surface of the substrate 11, and in a portion of the substrate 11. The back surface field layer 17 serves as a potential barrier of the substrate 11. Thus, because the back surface field layer 17 prevents or reduces a recombination and/or a disappearance of electrons and holes around the back surface of the substrate 11, the efficiency of the solar cell 10 is improved.

The substrate 11 is a semiconductor substrate, which may be formed of first conductive type silicon, for example, p-type silicon, though not required. Silicon used in the substrate 11 may be single crystal silicon, polycrystalline silicon, or amorphous silicon. When the substrate 11 is of a p-type, the substrate 11 contains impurities of a group III element such as boron (B), gallium (Ga), and indium (In).

The surface of the substrate 11 may be textured to form a textured surface corresponding to an uneven surface or having uneven characteristics having a plurality of uneven portions. When the surface of the substrate 11 is the textured surface, a light reflectance in the light receiving surface of the substrate 11 is reduced. Further, because both a light incident operation and a light reflection operation are performed on the textured surface of the substrate 11, light is confined in the solar cell 10. Hence, a light absorption increases, and the efficiency of the solar cell 10 is improved. In addition, because a reflection loss of light incident on the substrate 11 decreases, an amount of light incident on the substrate 11 further increases.

The emitter layer 12 is a region doped with impurities of a second conductive type (for example, an n-type) opposite the first conductive type of the substrate 11. The emitter layer 12 forms a p-n junction along with the substrate 11. When the emitter layer 12 is to be of the n-type, the emitter layer 12 may be formed by doping the substrate 11 with impurities of a group V element such as phosphor (P), arsenic (As), and antimony (Sb).

When energy of light incident on the substrate 11 is applied to the semiconductors of the substrate 11, carriers (e.g., electron-hole pairs, for example) are produced inside the semiconductors, and electrons move to the n-type semiconductor and holes move to the p-type semiconductor. Thus, when the substrate 11 is of the p-type and the emitter layer 12 is of the n-type, the holes move to the p-type substrate 11 and the electrons move to the n-type emitter layer 12.

Alternatively, the substrate 11 may be of an n-type and/or may be formed of semiconductor materials other than silicon. When the substrate 11 is of the n-type, the substrate 11 may contain impurities of a group V element such as phosphorus (P), arsenic (As), and antimony (Sb).

Because the emitter layer 12 forms the p-n junction along with the substrate 11, the emitter layer 12 is of the p-type when the substrate 11 is of the n-type. In this instance, electrons move to the n-type substrate 11 and holes move to the p-type emitter layer 12.

When the emitter layer 12 is of the p-type, the emitter layer 12 may be formed by doping a portion of the substrate 11 with impurities of a group III element such as boron (B), gallium (Ga), and indium (In).

The anti-reflection layer 15 on the emitter layer 12 may be formed of silicon nitride (SiNx), silicon dioxide ($SiO_2$), or titanium dioxide ($TiO_2$). The anti-reflection layer 15 reduces a reflectance of light incident on the solar cell 10 and increases a selectivity of a predetermined wavelength band of the incident light, thereby increasing the efficiency of the solar cell 10. The anti-reflection layer 15 may have a thickness of about 70 nm to 80 nm. The anti-reflection layer 15 may be omitted, if desired.

The plurality of front electrodes 13 on the emitter layer 12 are electrically and physically connected to the emitter layer 12 and are formed in one direction in a state where the adjacent front electrodes 13 are spaced apart from one another. Each of the front electrodes 13 collects carriers (e.g., electrons) moving to the emitter layer 12. Each of the front electrodes 13 is formed of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used for the front electrodes 13.

For example, the front electrodes 13 may be formed of an Ag paste containing lead (Pb). In this instance, the front electrodes 13 may be electrically connected to the emitter layer 12 by way of a process in which the Ag paste is coated on the anti-reflection layer 15 using a screen printing method and the substrate 11 is fired at a temperature of about 750° C. to 800° C. The electrical connection between the front electrodes 13 and the emitter layer 12 is performed by etching the anti-reflection layer 15 using the lead (Pb) contained in the Ag paste during the firing process and which then brings Ag particles of the Ag paste into contact with the emitter layer 12.

At least two front electrode current collectors 14 are formed on the emitter layer 12 in a direction crossing the front electrodes 13. The front electrode current collectors 14 are electrically and physically connected to the emitter layer 12 and the front electrodes 13. Thus, the front electrode current collectors 14 output carriers (e.g., electrons) transferred from the front electrodes 13 to an external device. The front electrode current collectors 14 are formed of at least one conductive material. The conductive material used for the front electrode current collectors 14 may be at least one selected from the group consisting of Ni, Cu, Ag, Al, Sn, Zn, In, Ti, Au, and a combination thereof. Other conductive materials may be used.

The front electrode current collectors 14 may be electrically connected to the emitter layer 12 through a punch through operation by way of a process in which the conductive material is applied to the anti-reflection layer 15, patterned, and fired, in the same manner as the front electrodes 13.

The back electrode 16 is formed on the surface (i.e., the back surface of the substrate 11) opposite the light receiving surface of the substrate 11. The back electrode 16 collects carriers (e.g., holes) moving to the substrate 11.

As shown in FIGS. 3 and 4, the back electrode 16 includes a plurality of electrode parts 16a that are spaced apart from one another at a space G1, which may or may not be uniform. The space G1 exposes the back surface of the substrate 11 so that a conductive adhesive film 60 to be described later contacts the back surface of the substrate 11. Because the interconnector 20 is attached to the conductive adhesive film 60, the number of electrode parts 16a is greater than the number of interconnectors 20 by one, for example.

The back electrode 16 including the plurality of electrode parts 16a is formed of at least one conductive material. The conductive material may be at least one selected from the group consisting of Ni, Cu, Ag, Al, Sn, Zn, In, Ti, Au, and a combination thereof. Other conductive materials may be used for the back electrode 16.

The back electrode 16 having the above-described configuration may be manufactured by applying a conductive paste containing the conductive material to the entire back surface of the substrate 11, drying and firing the conductive paste, removing the conductive paste existing at a location on which to form the conductive adhesive film 60, and forming the plurality of electrode parts 16a that are spaced apart from one another by the space G1. The edge portion of the back surface of the substrate 11 may be excluded when referring to the entire back surface of the substrate 11, in an embodiment of the invention.

In a method for manufacturing the back electrode 16, impurities are injected into the substrate 11 during the firing of the conductive paste. Thus, the back surface field layer 17 is formed during the firing of the conductive paste. Because a process for forming the space G1 may be performed after the conductive paste is fired, the back surface field layer 17 may still formed on the entire back surface of the substrate 11 even in a portion of the back surface of the substrate 11 that is located in the space G1. In an embodiment of the invention, a portion of the back electrode 16 need not be removed, or not formed, for example, so that a single sheet of black electrode 16 exits on the back surface of the substrate 11.

When the back electrode 16 does not include the plurality of electrode parts 16a, it is not easy to attach the conductive adhesive film 60 to the back surface of the back electrode 16 because of an oxide layer may be formed on the surface of the back electrode 16. Nevertheless, the oxide layer may be removed to enable the conductive adhesive film 60 to be attached directly to the back surface of the back electrode 16. In such an instance, the conductive adhesive film 60 is positioned between the back electrode 16 and the interconnector 20 without an intervening layer. Accordingly, the conductive adhesive film 60 is directly attached to (or in contact with) the back electrode 16 and the interconnector 20.

However, as described above, when the space G1 is formed between the plurality of electrode parts 16a, and the conductive adhesive film 60 is attached to the back surface of the substrate 11 exposed through the space G1, the adhesive strength of the conductive adhesive film 60 is improved compared with the back electrode 16 not including the electrode parts 16a.

As shown in FIG. 2, the solar cells 10 each having the above-described configuration are electrically connected to one another using the interconnector 20.

More specifically, the conductive adhesive film 60 is positioned on the front electrode current collectors 14 that is on the emitter layer 12 in a direction parallel to the front electrode current collectors 14. Another portion (or another end) of the conductive adhesive film 60, which is attached to the front electrode current collectors 14 of the adjacent solar cell, is attached to the back surface of the substrate 11 exposed through the space G1 between the plurality of electrode parts 16a.

FIG. 3 shows that one conductive adhesive film 60 is positioned on each of the front surface and the back surface of the substrate 11. Additionally, the same number of conductive adhesive films 60 as the number of interconnectors 20 is positioned respectively on each of the front surface and the back surface of the substrate 11.

The conductive adhesive film 60 includes a resin 62 and conductive particles 64 dispersed in the resin 62. A material of the resin 62 is not particularly limited as long as it has the adhesive property. It is preferable, but not required, that a thermosetting resin is used for the resin 62 so as to increase an adhesive reliability. The thermosetting resin may use at least one selected among epoxy resin, phenoxy resin, acryl resin, polyimide resin, and polycarbonate resin.

The resin 62 may further contain a predetermined material, for example, a known curing agent and a known curing accelerator other than the thermosetting resin. For example, the resin 62 may contain a reforming material such as a silane-based coupling agent, a titanate-based coupling agent, and an aluminate-based coupling agent, so as to improve an adhesive strength between the front electrode current collector 14 and the interconnector 20, and an adhesive strength between the back electrode 16 and the interconnector 20. The resin 62 may contain a dispersing agent such as calcium phosphate and calcium carbonate, so as to improve the dispersibility of the conductive particles 64. The resin 62 may contain a rubber component such as acrylic rubber, silicon rubber, and urethane rubber, so as to control the modulus of elasticity of the resin 62.

A material of the conductive particles 64 is not particularly limited as long as it has the conductivity. The conductive particles 64 may contain at least one metal selected among copper (Cu), silver (Ag), gold (Au), iron (Fe), nickel (Ni), lead (Pb), zinc (Zn), cobalt (Co), titanium (Ti), and magnesium (Mg) as the main component. The conductive particles 64 may be formed of only metal particles or metal-coated resin particles. The conductive adhesive film 60 having the above-described configuration may include a peeling film.

It is preferable, but not required, that the conductive particles 64 use the metal-coated resin particles, so as to mitigate a compressive stress of the conductive particles 64 and improve a connection reliability of the conductive particles 64. It is preferable, but not required, that the conductive particles 64 have a diameter of about 2 µm to 30 µm, so as to improve the dispersibility of the conductive particles 64.

It is preferable, but not required, that a composition amount of the conductive particles 64 dispersed in the resin 62 is about 0.5% to 20% based on the total volume of the conductive adhesive film 60 in consideration of the connection reliability after the resin 62 is cured.

When the composition amount of the conductive particles 64 is less than about 0.5%, a current may not smoothly flow because a physical contact area between the back surface of the substrate 11 and the front electrode current collector 14 decreases. When the composition amount of the conductive particles 64 is greater than about 20%, the adhesive strength may be reduced because a composition amount of the resin 62 relatively decreases.

The conductive adhesive film 60 is attached to the front electrode current collector 14 in the direction parallel to the front electrode current collector 14 and is attached to the back surface of the substrate 11 exposed between the electrode parts 16a of the back electrode 16. When a tabbing process is performed using the conductive adhesive film 60, a heating temperature and a pressure are not particularly limited as long as they are within the range capable of securing an electrical connection and maintaining the adhesive strength.

For example, the heating temperature may be set to a temperature capable of curing the resin 62, for example, about 140° C. to 180° C. The pressure may be set to a range capable of sufficiently attaching the front electrode current collector 14, the substrate 11, and the interconnector 20 to the conductive adhesive film 60. Further, a heating and pressure time may be set to the extent that the front electrode current collector 14, the substrate 11, the interconnector 20, etc., are not damaged or deteriorated because of heat.

Figure 5:
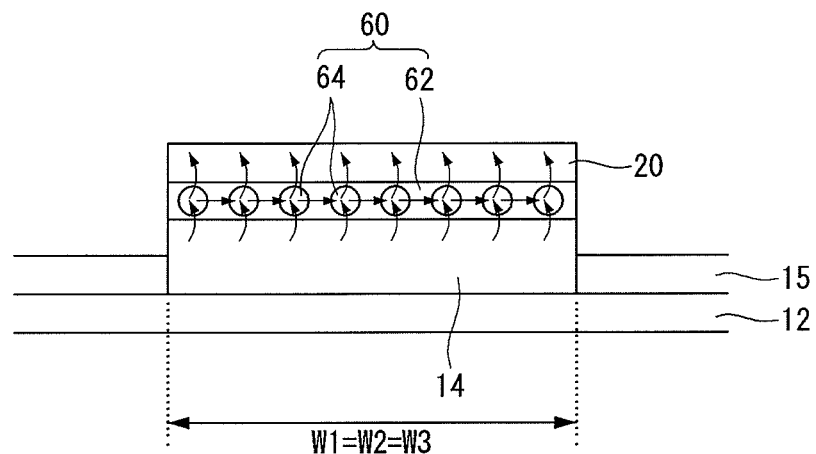
FIGS. 5 to 10 are cross-sectional views illustrating various assembly configurations of a front surface of a substrate of the solar cell in the solar cell panel shown in FIG. 3.

As shown in FIG. 5, the resin 62 may be positioned between the conductive particles 64 and the front electrode current collector 14 and between the conductive particles 64 and the interconnector 20 in a state where the front electrode current collector 14 is attached to the interconnector 20 using the conductive adhesive film 60.

In this instance, carriers moving to the front electrode current collector 14 jump to the conductive particles 64 and then again jump to the interconnector 20 as indicated by an arrow shown in FIG. 5. Further, carriers jumping to the conductive particles 64 may jump to the adjacent conductive particles 64 as indicated by the arrow shown in FIG. 5. In other words, the carriers moving to the front electrode current collector 14 move along as indicated by the arrow shown in FIG. 5 and then move to the interconnector 20.

A distance between the conductive particles 64 may be properly set so that the carriers can jump between the adjacent conductive particles 64. The distance between the conductive particles 64 may be set by properly adjusting the number or the size of the conductive particles 64 dispersed in the resin 62.

Thus, the carriers moving to the front electrode current collector 14 are transferred to the interconnector 20 through the conductive particles 64.

Alternatively, the conductive particles 64 may directly contact one or both of the front electrode current collector 14 and the interconnector 20.

Figure 6:
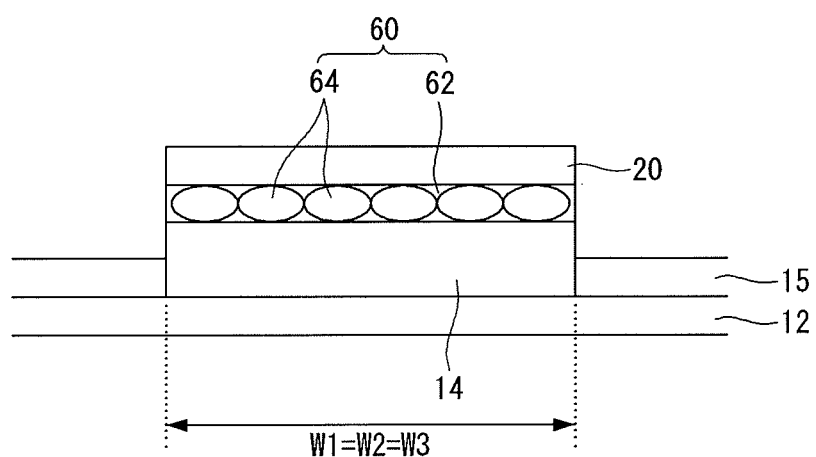

For example, as shown in FIG. 6, the conductive particles 64 may directly contact each of the front electrode current collector 14 and the interconnector 20, and may be elastically modified into an oval shape because of the pressure applied during the tabbing process. Thus, as shown in FIG. 3, it is preferable, but not required, that a width W1 of the conductive adhesive film 60 is greater than a thickness T1 of the conductive adhesive film 60.

In the structure shown in FIG. 6, because the carriers moving to the front electrode current collector 14 are directly transferred to the interconnector 20 through the conductive particles 64, a current in the structure shown in FIG. 6 more smoothly flows than the structure shown in FIG. 5.

As shown in FIG. 6, the adjacent conductive particles 64 may physically contact one another so that the carriers moving to the front electrode current collector 14 are sufficiently transferred to the interconnector 20. Further, at least two conductive particles 64 may be positioned on the front electrode current collector 14.

A width of each of the front electrode current collector 14, the conductive adhesive film 60, and the interconnector 20 may vary.

In the example embodiment of the invention, as shown in FIGS. 5 to 10, a width of the conductive adhesive film 60 is referred to as a first width W1, a width of the interconnector 20 is referred to as a second width W2, and a width of the front electrode current collector 14 is referred to as a third width W3.

As shown in FIGS. 5 and 6, the first width W1 of the conductive adhesive film 60, the second width W2 of the interconnector 20, and the third width W3 of the front electrode current collector 14 are substantially equal to one another (i.e., W1=W2=W3). In this instance, when the tabbing process is performed using the conductive adhesive film 60, an alignment process may be performed very accurately.

Thus, the third width W3 of the front electrode current collector 14 may be equal to or less than about 2.0 mm.

Figure 7:
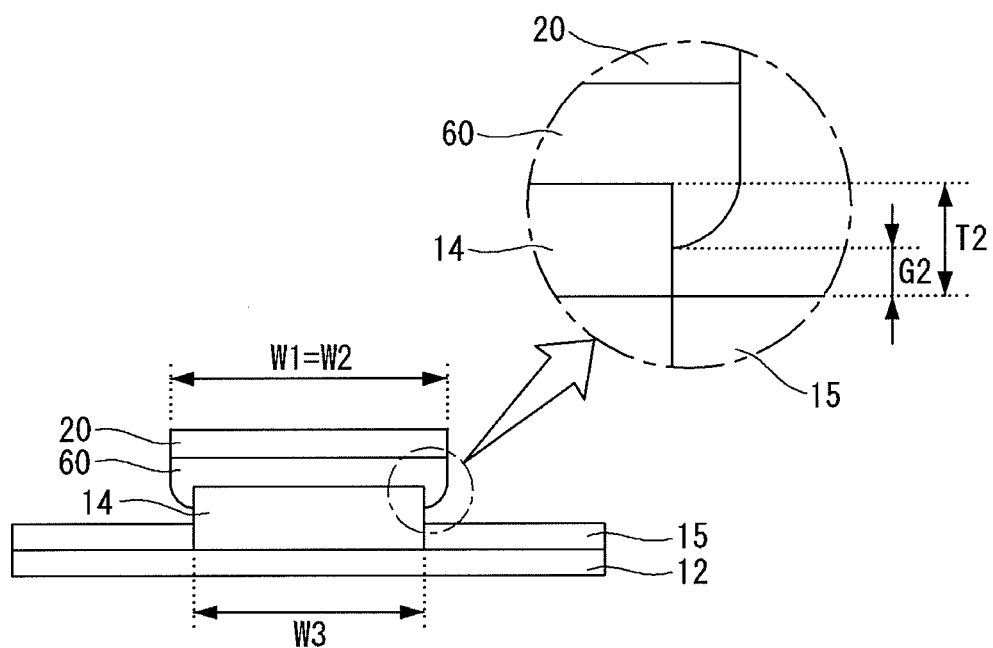

Further, as shown in FIG. 7, the first width W1 and the second width W2 may be substantially equal to each other, and the first width W1 and the second width W2 may be greater than the third width W3. In this instance, it is preferable, but not required, that the first width W1 and the second width W2 are equal to or less than about 1.5 times the third width W3.

When the first width W1 is greater than the third width W3, a portion of the conductive adhesive film 60 is attached to a portion of a side surface of the front electrode current collector 14 at a distance G2 from the surface of the substrate 11, i.e., the surface of the anti-reflection layer 15. The distance G2 is equal to or greater than about 0.1 times a protruding thickness T2 of the front electrode current collector 14.

Figure 8:
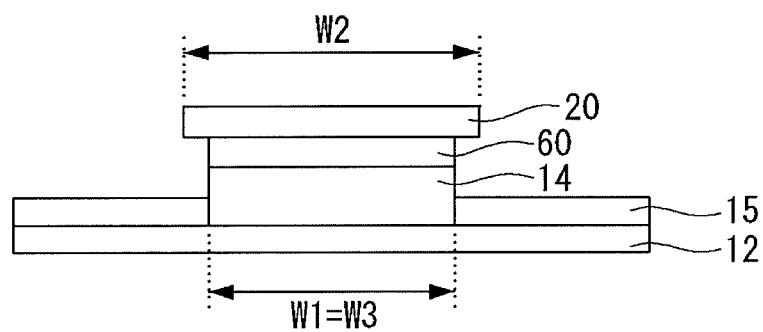

Further, as shown in FIG. 8, the first width W1 may be less than the second width W2 and may be substantially equal to the third width W3. In this instance, the second width W2 is equal to or less than about 1.5 times the first width W1 and the third width W3.

Figure 9:
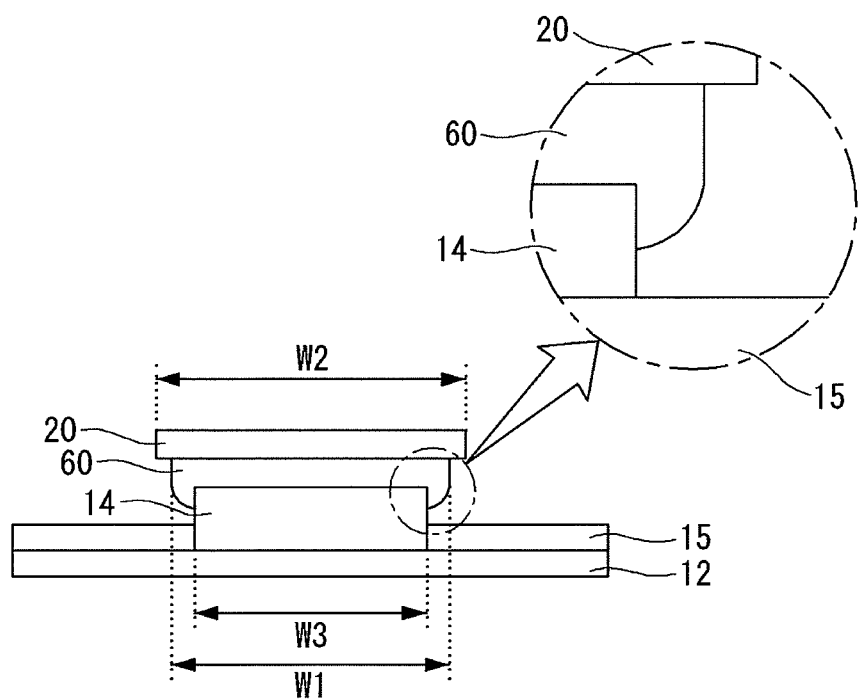

Further, as shown in FIG. 9, the first width W1 may be less than the second width W2 and may be greater than the third width W3. In this instance, the second width W2 is equal to or less than about 1.5 times the first width W1 and the third width W3. Further, a portion of the conductive adhesive film 60 is attached to a portion of a side surface of the front electrode current collector 14 at the distance G2 from the surface of the substrate 11, i.e., the surface of the anti-reflection layer 15. The distance G2 is equal to or greater than about 0.1 times the protruding thickness T2 of the front electrode current collector 14.

Figure 10:
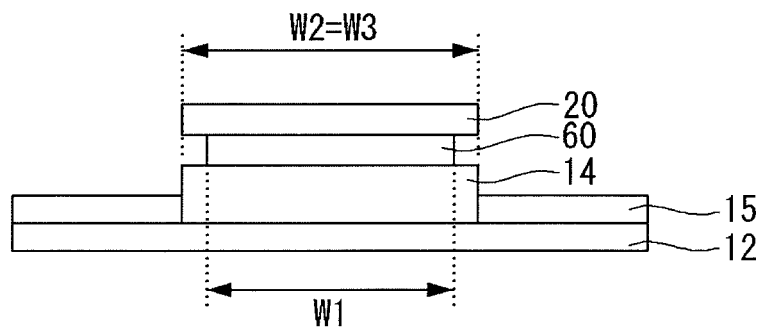

Further, as shown in FIG. 10, the second width W2 may be substantially equal to the third width W3, and the second width W2 and the third width W3 may be greater than the first width W1. In this instance, the second width W2 and the third width W3 are equal to or less than about 1.5 times the first width W1.

Other conductive adhesive film 60 is attached to the back surface of the substrate 11, and the interconnector 20 is attached to a back surface of the conductive adhesive film 60 in the same direction as a formation direction of the conductive adhesive film 60. In this instance, a half potion of the interconnector 20 is electrically connected to the front electrode current collector 14 of the adjacent solar cell 10. Thus, the adjacent solar cells 10 are electrically connected to one another.

With respect to a back surface of a substrate of a solar cell, and as shown in FIG. 11, the resin 62 may be positioned between the conductive particles 64 and the substrate 11 and between the conductive particles 64 and the interconnector 20 in a state where the substrate 11 is attached to the interconnector 20 using the conductive adhesive film 60. Such may occur when a thickness T1 of the conductive adhesive film 60 is substantially equal to or slightly greater than a thickness T3 of the back electrode 16 (i.e., T1≥T3).

However, as described above, even if the resin 62 is positioned between the conductive particles 64 and the substrate 11 and between the conductive particles 64 and the interconnector 20, carriers passing through the back surface field layer 17 may jump to the conductive particles 64 and then may again jump to the interconnector 20. Thus, the carriers passing through the back surface field layer 17 moves along as indicated by the arrow shown in FIG. 11 and then move to the interconnector 20.

In this instance, a distance between the conductive particles 64 may be properly set. The distance between the conductive particles 64 may be set by properly adjusting the number or the size of the conductive particles 64 dispersed in the resin 62.

The width W2 of the interconnector 20 may be substantially equal to or greater than a width W4 of the space G1 (i.e., W2≥W4). An example where the width W2 of the interconnector 20 is greater than the width W4 of the space G1 is illustrated by the dotted line shown in FIG. 11.

As above, when the width W2 of the interconnector 20 is greater than the width W4 of the space G1, a portion of the interconnector 20 contacts a portion of the electrode part 16a if the thickness T1 of the conductive adhesive film 60 is equal to the thickness T3 of the back electrode 16.

However, as shown in FIG. 12, when the thickness T1 of the conductive adhesive film 60 is greater than the thickness T3 of the back electrode 16, the conductive adhesive film 60 may be attached to a portion of the electrode part 16a during the tabbing process. Therefore, in this instance, the interconnector 20, or a portion thereof, does not directly contact the electrode part 16a, and the conductive adhesive film 60 may be positioned between the interconnector 20 and the electrode part 16a.

Alternatively, as shown in FIG. 13, the conductive particles 64 may directly contact one or both of the substrate 11 and the interconnector 20. This may be generated when the thickness T1 of the conductive adhesive film 60 is less than the thickness T3 of the back electrode 16 (i.e., T1<T3).

As above, when the thickness T1 of the conductive adhesive film 60 is less than the thickness T3 of the back electrode 16, the width W2 of the interconnector 20 may be equal to or less than the width W4 of the space G1 (i.e., W2≤W4), so that the total area of the interconnector 20 sufficiently contacts the conductive adhesive film 60.

The conductive particles 64 may be modified into an oval shape because of the pressure applied during the tabbing process, as shown in FIG. 13. Thus, it is preferable, but not required, that the width W1 of the conductive adhesive film 60 is greater than the thickness T1 of the conductive adhesive film 60.

In the structure shown in FIG. 13, because the carriers passing through the back surface field layer 17 are directly transferred to the interconnector 20 through the conductive particles 64, a current flows more smoothly than the structure shown in FIG. 11.

The back electrode 16 including the electrode parts 16a may be manufactured using methods other than the above-described method.

For example, the back electrode 16 including the electrode parts 16a may be manufactured using a mask in which the space G1 is formed without separately performing a process for forming the space G1 by removal of a portion of the back electrode 16.

However, in this instance, the back surface field layer 17 formed during the process for firing the conductive paste has the same pattern as the back electrode 16.

In other words, the back surface field layer 17 is formed in only a portion of the substrate 11, on which the electrode part 16a is positioned, and is not formed in a portion of the substrate 11 on which the space G1 is positioned. An example where the back surface field layer 17 is formed in only the portion of the substrate 11 on which the electrode part 16a is positioned is illustrated in FIG. 13.

In the structure shown in FIG. 13, carriers from the substrate 11 are transferred to the interconnector 20 through the conductive particles of the conductive adhesive film 60. Thus, because the back electrode current collector is not necessary, the process and the cost required to form the back electrode current collector may be reduced.

Further, when the substrate 11 is directly connected to the interconnector 20 using the conductive adhesive film 60, the tabbing process may be performed at a low temperature, for example, at 140° C. to 180° C. As above, when the tabbing process is performed at the low temperature, a bowing phenomenon and a damage of the substrate may be prevented or reduced more sufficiently or readily than as compared to when the tabbing process is performed using a soldering at a high temperature, for example, at a temperature equal to or higher than 220° C.

Further, because a flux is not used, the adhesive strength between the interconnector 20 and the substrate 11 may be uniformly maintained, and a misalignment may be prevented or reduced. Hence, an output reduction thereof may be prevented or reduced.

A solar cell in a solar cell panel according to a second example embodiment of the invention is described below with reference to FIGS. 14 to 15C. Since the solar cell in the solar cell panel according to the second example embodiment of the invention is substantially the same as the first example embodiment except a structure of an interconnector, only the interconnector is described below in the second example embodiment.

An interconnector 21 is used to electrically connect two adjacent solar cells to each other. More specifically, a half portion of the interconnector 21 is electrically connected to a front electrode current collector of one solar cell in a longitudinal direction of the interconnector 21, and a remaining half portion of the interconnector 21 is electrically connected to a back surface of a substrate of other solar cell adjacent to the one solar cell.

Both surfaces of the interconnector 20 used in the solar cell panel according to the first example embodiment of the invention are flat surfaces. Thus, when a space between the electrode parts 16a of the back electrode 16 is narrow, a difficulty in performing the tabbing process may be generated when a width of a tab of a tabbing equipment is greater than a width of the space and when a thickness of the electrode part 16a is greater than the thickness of the conductive adhesive film 60. As a result, because heat and the pressure are not sufficiently applied, an electrical connection through the conductive particles may not be sufficiently achieved.

To solve the above-described problem, it is preferable, but not required, that the space between the electrode parts 16a increases so that the tabbing process can be sufficiently performed. However, when the space between the electrode parts 16a increases, an output of the solar cells is reduced.

Accordingly, the interconnector 21 according to the second example embodiment of the invention has different thicknesses along its longitudinal direction, and thus the above-described problem may be solved or addressed.

More specifically, one surface of the interconnector 21 may be a flat surface, and a surface opposite the flat surface may be a nonuniform surface protruding in a direction far from (or away from) the flat surface.

Figure 14:
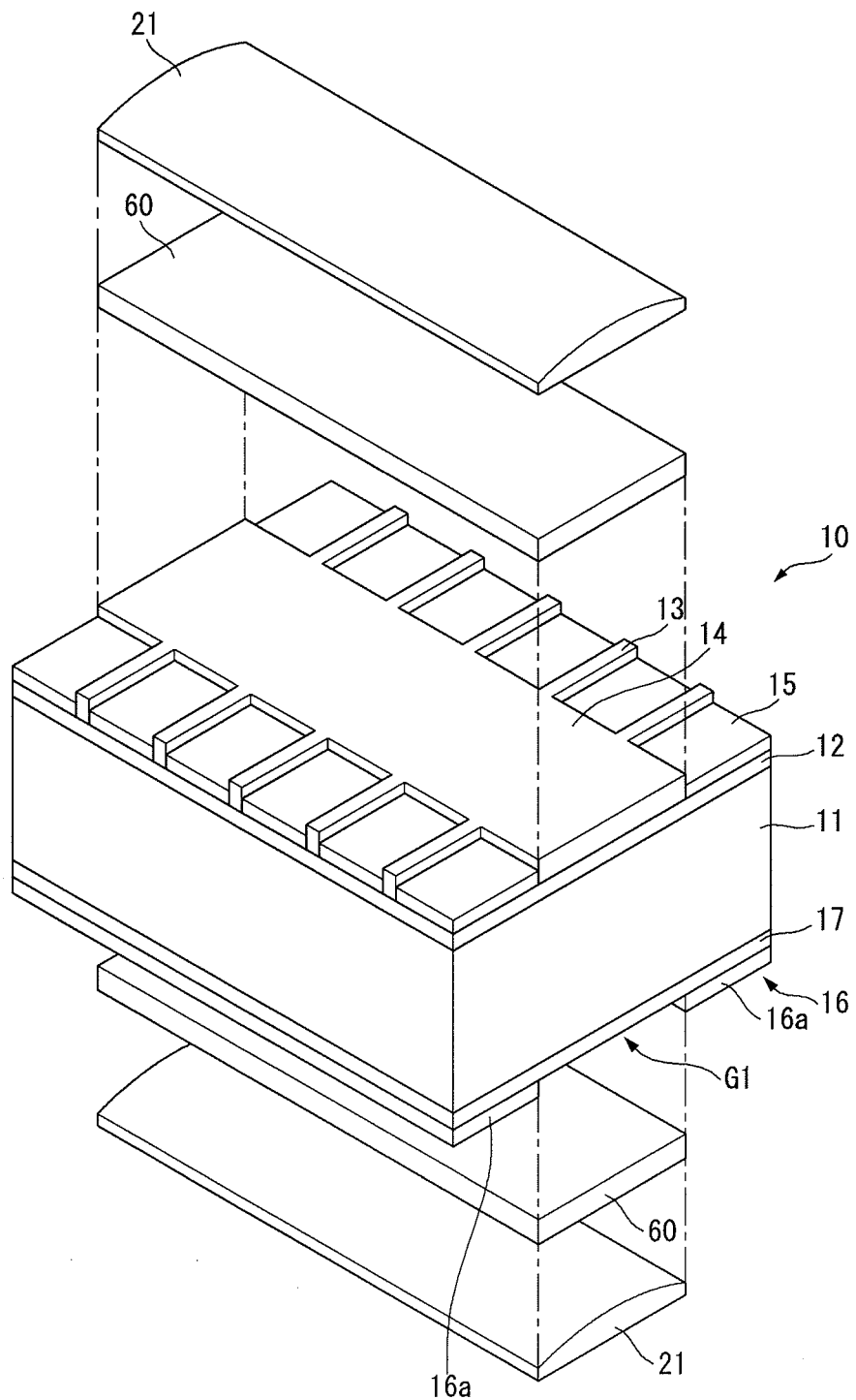
FIG. 14 is an exploded perspective view illustrating a configuration of a solar cell in a solar cell panel according to a second example embodiment of the invention.
Figure 15A:
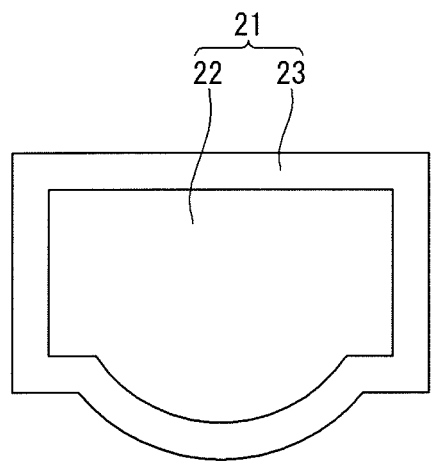
FIGS. 15A to 15C are cross-sectional views illustrating various configurations of an interconnector used in the solar cell in the solar cell panel shown in FIG. 14.
Figure 15B:
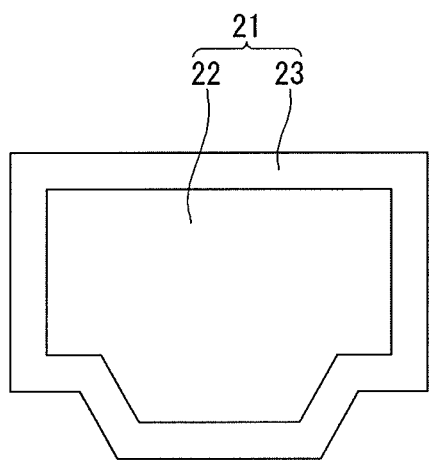
Figure 15C:
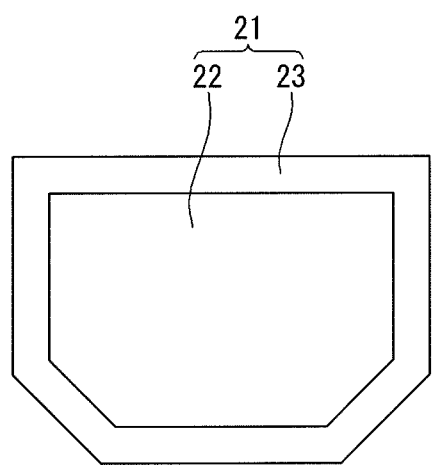

As shown in FIG. 14, the nonuniform surface of the interconnector 21 may be a curved surface. Further, as shown in FIGS. 15A to 15C, the nonuniform surface of the interconnector 21 may be formed using at least one of a curved surface and a flat surface or using at least one of a flat surface and an inclined surface. Other shapes may be used for the interconnector 21, such as a wavy surface.

The interconnector 21 may be formed of only a conductive metal 22 as shown in FIG. 14. Further, the interconnector 21 may be formed of a conductive metal 22 and a solder 23 surrounding the conductive metal 22 as shown in FIGS. 15A to 15C.

The nonuniform surface of the interconnector 21 may be formed over the entire length of the interconnector 21 or may be formed in only a portion thereof attached to the back surface of the substrate. Thus, when the nonuniform surface of the interconnector 21 is formed in only the portion thereof attached to the back surface of the substrate, both surfaces of a portion of the interconnector 21 attached to the front electrode current collector are flat surfaces.

The interconnector having the above-described structure is positioned on the back surface of the conductive adhesive film in a state where the conductive adhesive film is applied and pressed in a space between the back electrodes, and then the tabbing process is performed using the tabbing equipment. In this instance, the tabbing process may be accurately performed irrespective of the width of the tab of the tabbing equipment, the space between the back electrodes, and the thickness of the back electrodes.

A solar cell in a solar cell panel according to a third example embodiment of the invention is described below with reference to FIGS. 16 to 21. Since an electrode structure and a tabbing structure in a back surface of a substrate in the third example embodiment are substantially the same as the first example embodiment, a further description may be briefly made or may be entirely omitted. An electrode structure and a tabbing structure at a front surface of the substrate according to the third example embodiment are described below.

Figure 16:
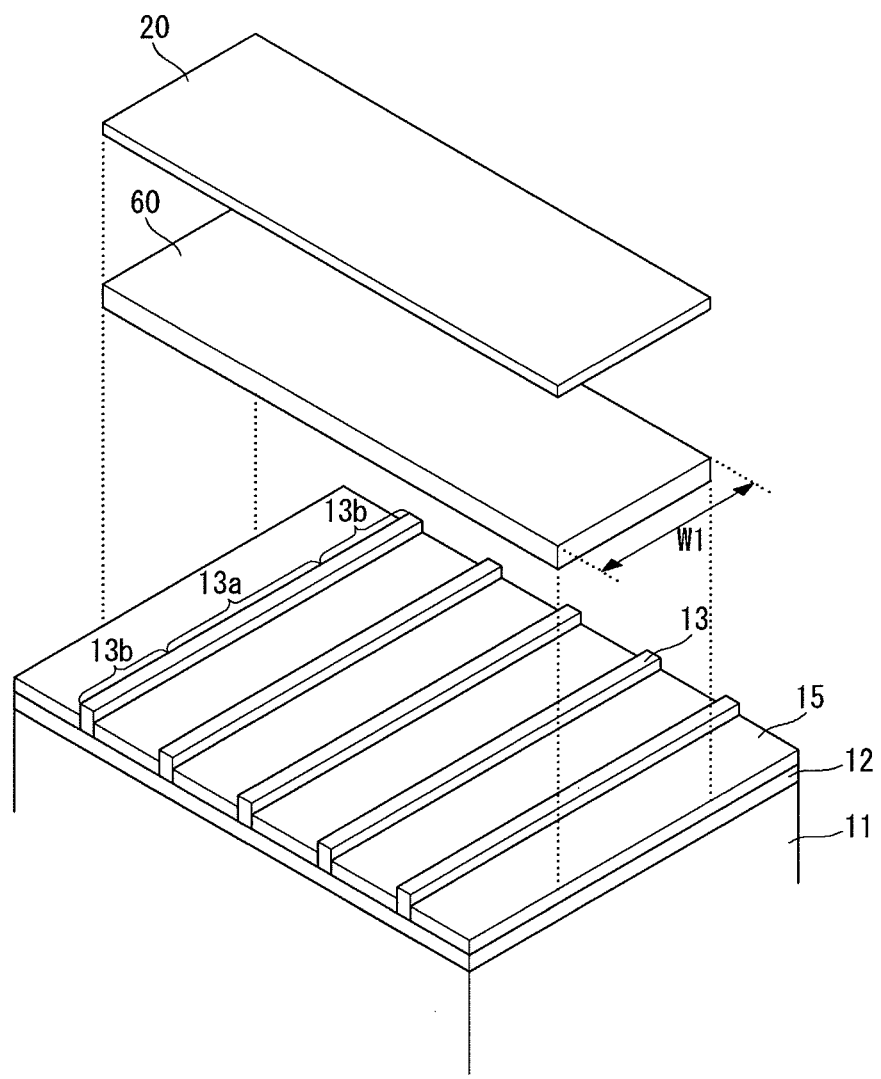
FIG. 16 is an exploded perspective view illustrating a configuration of a solar cell in a solar cell panel according to a third example embodiment of the invention.
Figure 17:
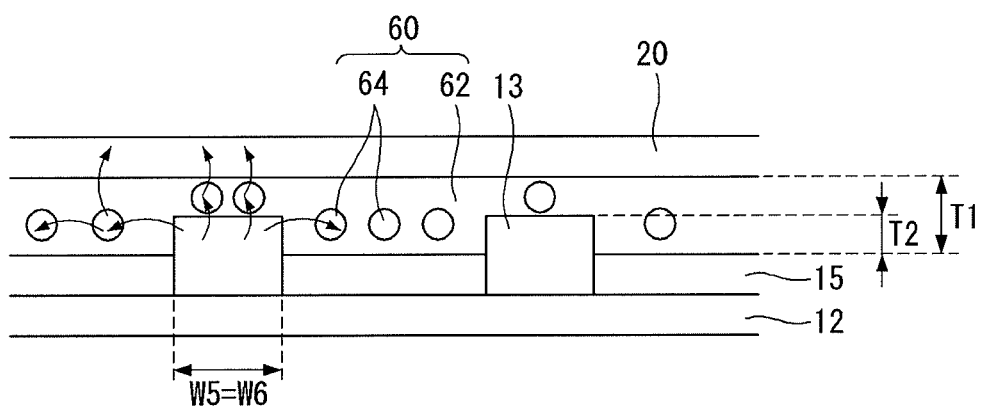
FIGS. 17 to 19 are cross-sectional views illustrating various assembly configurations of the solar cell in the solar cell panel shown in FIG. 16.
Figure 18:
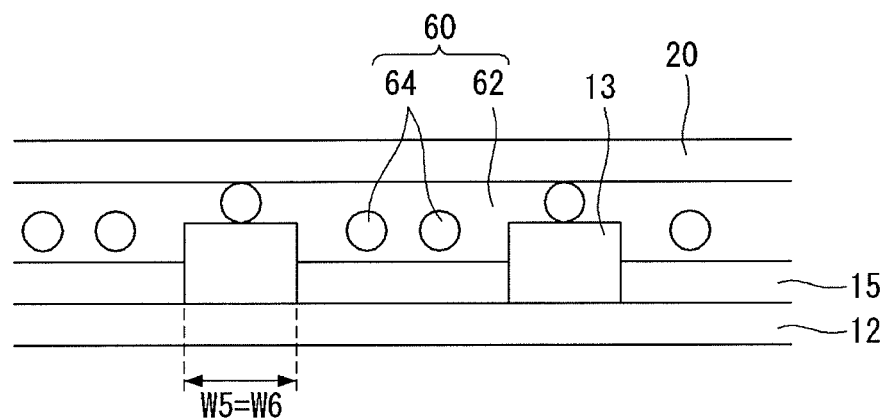
Figure 19:
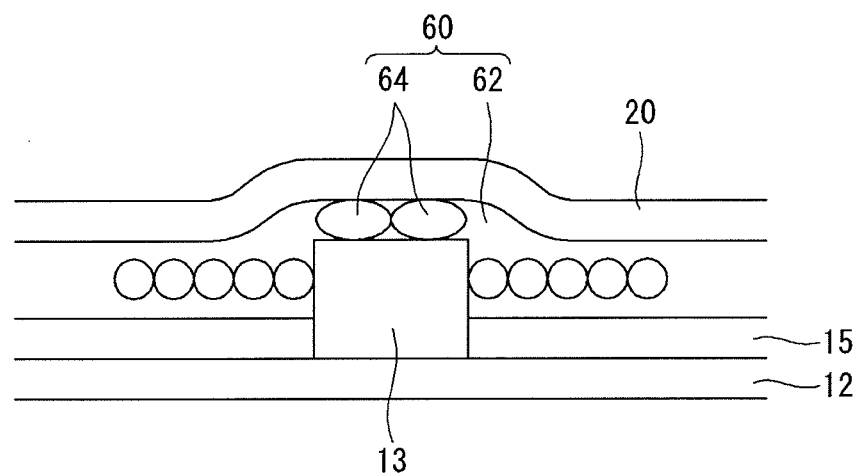
Figure 20:
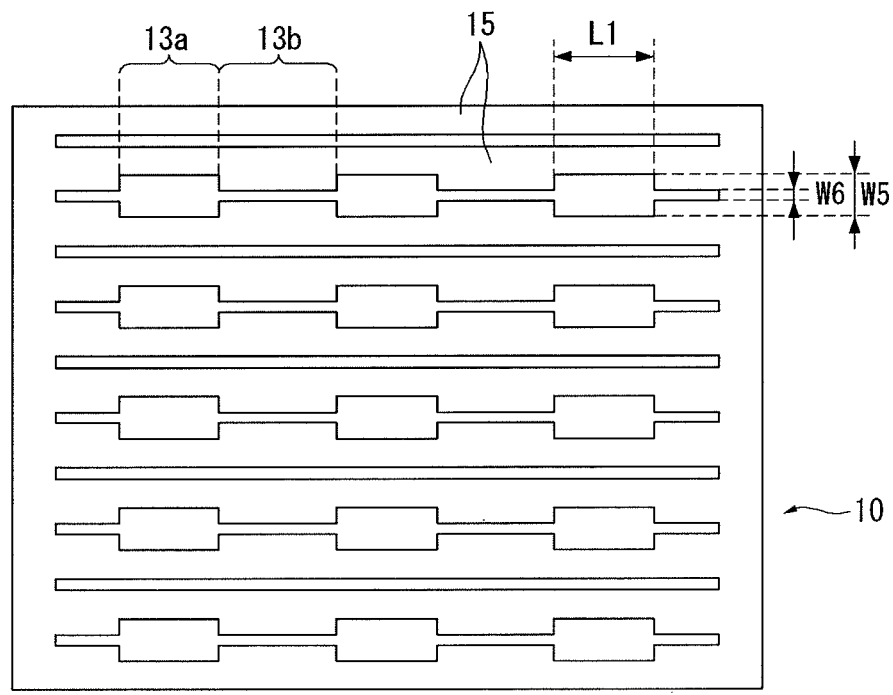
FIGS. 20 and 21 are plane views of a front surface of a substrate the solar cell and illustrating various configurations of a front electrode.
Figure 21:
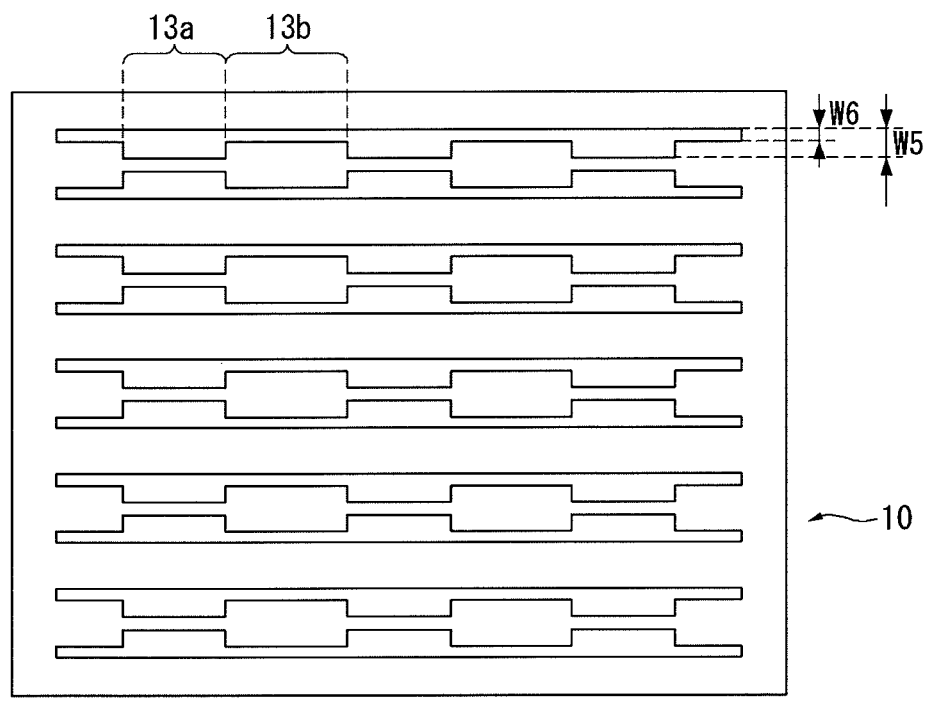

FIG. 16 is an exploded perspective view illustrating a configuration of the solar cell in the solar cell panel according to the third example embodiment of the invention. FIGS. 17 to 19 are cross-sectional views illustrating various assembly configurations of the solar cell in the solar cell panel shown in FIG. 16. FIGS. 20 and 21 are plane views of the front surface of the substrate of the solar cell illustrating various configurations of a front electrode.

Structures and components identical or equivalent to those described in the first and third example embodiments are designated with the same reference numerals, and a further description may be briefly made or may be entirely omitted.

As shown in FIG. 16, unlike the first example embodiment, only a plurality of front electrodes 13 are positioned on an emitter layer 12 of a substrate 11. In other words, the front electrode current collector is not formed in the solar cell of the third example embodiment.

A plurality of conductive adhesive films 60 are positioned on a front surface of the substrate 11 in a direction crossing the front electrodes 13. Each of the plurality of conductive adhesive films 60 includes a resin 62 and a plurality of conductive particles 64 dispersed in the resin 62.

The conductive adhesive film 60 is attached to a portion of each front electrode 13 in the direction crossing the front electrodes 13 through a process performed at a low temperature, for example, at about 140° C. to 180° C. Thus, a portion of the conductive adhesive film 60 directly contacts the portions of the front electrodes 13, and a remaining portion of the conductive adhesive film 60 directly contacts an anti-reflection layer 15. Thus, the conductive adhesive film 60 is positioned between the front electrodes 13 and the interconnector 20 without an intervening layer, and/or the conductive adhesive film 60 is positioned between the anti-reflection layer 15 and the interconnector 20 without an intervening layer. Accordingly, the conductive adhesive film 60 is directly attached to (or in contact with) the front electrodes 13 (and/or and anti-reflection layer 15) and the interconnector 20.

Each front electrode 13 includes a first portion 13a attached to the conductive adhesive film 60 and a second portion 13b not attached to the conductive adhesive film 60.

An interconnector 20 is attached to a front surface of the conductive adhesive film 60 attached to the first portion 13a of the front electrode 13 in the same direction as a formation direction of the conductive adhesive film 60. The interconnector 20 is the interconnector that is also attached to a back surface of a substrate of the adjacent solar cell.

As shown in FIG. 17, the resin 62 may be positioned between the conductive particles 64 and the front electrode 13 and between the conductive particles 64 and the interconnector 20 in a state where the front electrodes 13 is attached to the interconnector 20 using the conductive adhesive film 60.

In this instance, carriers moving to the front electrode 13 jump to the conductive particles 64 and then again jump to the interconnector 20. Further, carriers jumping to the conductive particles 64 may jump to the adjacent conductive particles 64. Thus, the carriers moving to the front electrode 13 move along as indicated by an arrow shown in FIG. 17 and then move to the interconnector 20.

A distance between the conductive particles 64 may be properly set so that carriers can jump between the adjacent conductive particles 64. The distance between the conductive particles 64 may be set by properly adjusting the number or the size of the conductive particles 64 dispersed in the resin 62.

Thus, the carriers moving to the front electrode 13 are transferred to the interconnector 20 through the conductive particles 64.

Further, as shown in FIG. 18, the conductive particles 64 may directly contact one or both of the front electrode 13 and the interconnector 20. In the structure shown in FIG. 18, because the carriers moving to the front electrode 13 are directly transferred to the interconnector 20 through the conductive particles 64, a current in the structure shown in FIG. 18 more smoothly flows than the structure shown in FIG. 17.

A remaining portion of the conductive adhesive film 60 not attached to the first portion 13a of the front electrode 13 directly contacts the anti-reflection layer 15 on the emitter layer 12.

The conductive adhesive film 60 may have a thickness T1 greater than a protruding thickness T2 of the front electrode 13, so that the conductive adhesive film 60 and the interconnector 20 are sufficiently attached to each other. In this instance, because a front surface of the conductive adhesive film 60 is a flat surface, the conductive adhesive film 60 and the interconnector 20 are sufficiently attached to each other.

Because a thickness of the front electrode 13 is generally equal to or less than about 15 μm, the protruding thickness T2 of the front electrode 13 is less than about 15 μm. Thus, the thickness T1 of the conductive adhesive film 60 may be about 15 μm to 60 μm based on specifications of the solar cell to be used in the solar cell panel.

Further, as shown in FIG. 19, the conductive adhesive film 60 may have a height difference. The adjacent conductive particles 64 may physically contact one another, so that the carriers moving to the front electrodes 13 are sufficiently transferred to the interconnector 20. Further, at least two conductive particles 64 may be positioned on the front electrode 13.

When the conductive adhesive film 60 has the height difference, the interconnector 20 may have the same height difference as the conductive adhesive film 60. The interconnector 20 may have a portion, whose surface protrudes, because of the conductive particles 64.

As shown in FIG. 19, the conductive particles 64 may be modified into an oval shape because of pressure applied during the tabbing process.

In the structure shown in FIGS. 17 and 18, a width W5 of the first portion 13a is substantially equal to a width W6 of the second portion 13b. Alternatively, in other embodiments of the invention, the first and second portions 13a and 13b of the front electrode 13 may have different widths.

As shown in FIG. 20, the width W5 of the first portion 13a is greater than the width W6 of the second portion 13b. When the width W5 of the first portion 13a is greater than the width W6 of the second portion 13b, an adhesive strength between the conductive adhesive film 60 and the front electrode 13 is improved, and a contact resistance between the conductive adhesive film 60 and the front electrode 13 decreases. Hence, an output reduction thereof may be prevented or reduced.

The first portion 13a having the width W5 greater than the width W6 of the second portion 13b may be formed in only the front electrodes 13 positioned on predetermined rows, and the first portion 13a having the same width as the second portion 13b may be formed in the front electrodes 13 positioned on remaining rows. For example, as shown in FIG. 20, each of the front electrodes 13 positioned on even-numbered rows may include the first portion 13a having the width W5 greater than the width W6 of the second portion 13b, and each of the front electrodes 13 positioned on odd-numbered rows may include the first portion 13a having the same width as the second portion 13b.

The first portion 13a having the width W5 greater than the width W6 of the second portion 13b may be formed in only the front electrodes 13 positioned on the odd-numbered rows and/or may have various shapes other than the shape shown in FIG. 20. For example, the various shapes may include a triangle or a semicircle.

The first portion 13a is formed in an up-down symmetric manner based on the front electrode 13 and has a predetermined length L1 in a longitudinal direction of the front electrode 13. It is preferable, but not required, that the predetermined length L1 of the first portion 13a is equal to or less than a width W1 of the conductive adhesive film 60, so as to improve the adhesive strength between the conductive adhesive film 60 and the front electrodes 13, and reduce the contact resistance between the conductive adhesive film 60 and the front electrodes 13.

When the width W1 of the conductive adhesive film 60 is less than about 1 mm, the contact resistance increases. When the width W1 of the conductive adhesive film 60 is greater than about 20 mm, the light receiving area decreases. Thus, the width W1 of the conductive adhesive film 60 may be about 1 mm to 20 mm.

Thus, the predetermined length L1 of the first portion 13a may be properly set within the range of the width W1 of the conductive adhesive film 60 based on specifications of the solar cell.

Alternatively, as shown in FIG. 21, each of the front electrodes 13 positioned on all of the rows may include the first portion 13a having the width W5 greater than the width W6 of the second portion 13b.

The adjacent first portions 13a may protrude opposite each other. The adjacent first portions 13a may protrude in the same direction. In this embodiment of the invention, the first portions 13a extend away from the front electrodes 13, or middle portions thereof, at one side. Thus, along a length of the front electrode 13 in one row, the first portions 13a exits on only one side of the front electrode 13. In the embodiment of the invention shown in FIG. 21, the first portions 13a of adjacent front electrodes 13 face each other. But in other embodiments, the first portions 13a of the adjacent front electrodes 13 may be on the same side, respectively, so that the first portions 13a would all face towards the same side, such as downward or upward in FIG. 21, for example. In embodiments of the invention, the first portions 13a are flaps that extend from the front electrodes 13 at one or both sides thereof.

In the example embodiment, because the front electrode current collector and the back electrode current collector do not need to be formed, the process and the cost required to form the current collectors may be further reduced or eliminated.

Further, the bowing phenomenon and the damage of the substrate may be prevented or reduced, and the output reduction thereof may be prevented or reduced.

Figure 22:
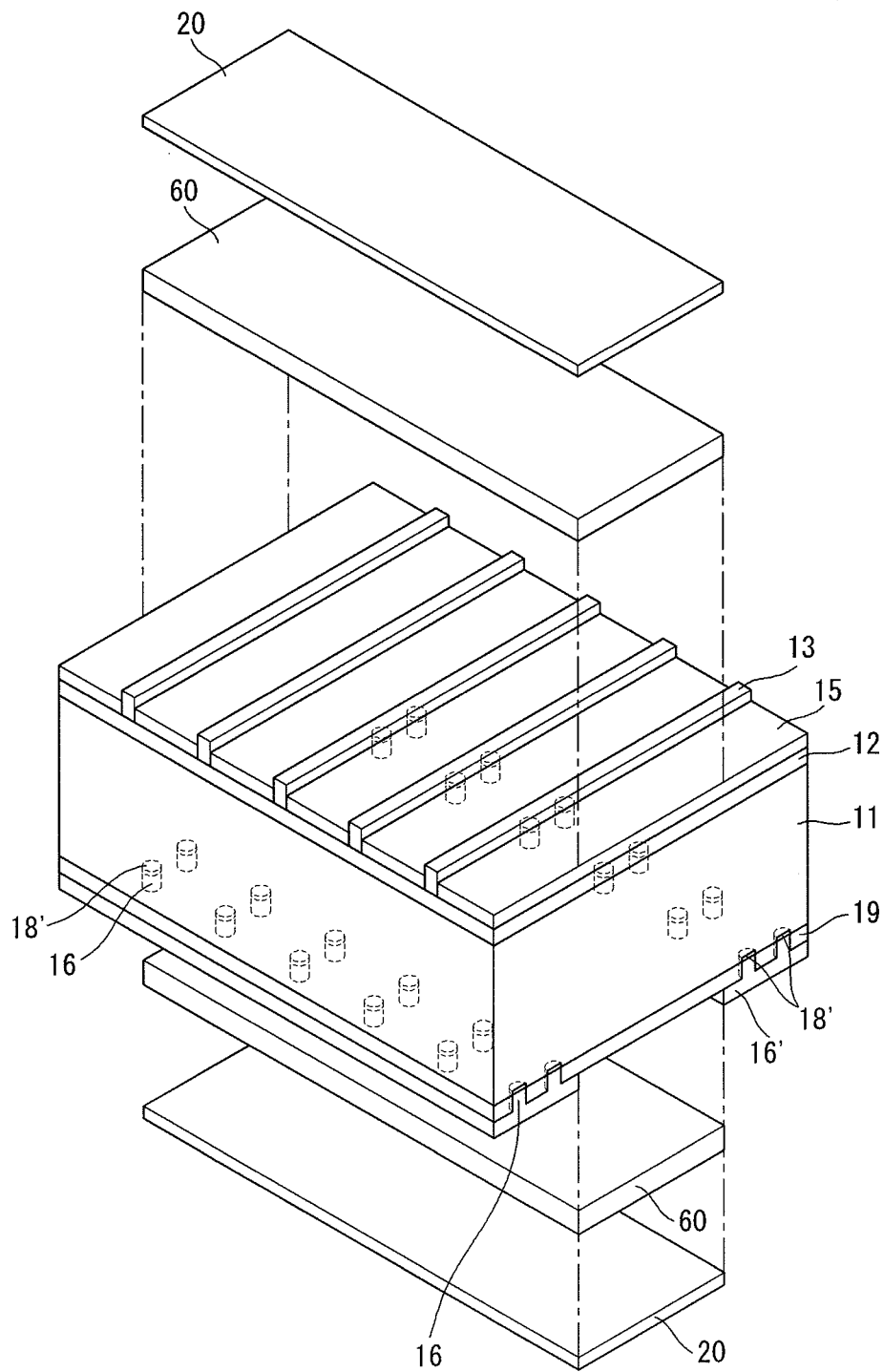
FIG. 22 is an exploded perspective view illustrating a configuration of a solar cell in a solar cell panel according to a fourth example embodiment of the invention.

FIG. 22 is an exploded perspective view illustrating a configuration of a solar cell in a solar cell panel according to a fourth example embodiment of the invention.

In the fourth example embodiment, a passivation layer 19 is positioned on a back surface of a substrate 11, a plurality of back electrode conductive layers 16' including a plurality of back electrodes 16 electrically connected to the substrate 11 is positioned on a back surface of the passivation layer 19, and a back surface field layer 18' is positioned between the back electrode conductive layer 16' and the substrate 11.

The passivation layer 19 on the back surface of the substrate 11 reduces a recombination rate of carriers around the surface of the substrate 11 and increases a reincidence rate of light passing through the substrate 11 by increasing an internal reflectance of the light passing through the substrate 11. The passivation layer 19 has a single-layered structure or a multi-layered structure.

The back electrode conductive layers 16' are positioned at areas of the passivation layer 19 that does not have the conductive adhesive film 60 attached thereto. The back electrode conductive layers 16' may be formed of a conductive material such as aluminum. Other materials may be used.

The back electrode conductive layers 16' pass through the passivation layer 19 and include the plurality of back electrodes 16 that are electrically connected to a portion of the substrate 11.

As shown in FIG. 22, the plurality of back electrodes 16 are spaced from one another at a predetermine distance, for example, at a distance of about 0.5 mm to 1 mm and are electrically connected to the substrate 11. The back electrodes 16 may have various shapes such as a circle, an oval, and a polygon, for example, in cross section. Each of the back electrodes 16 may have a stripe shape that extends in one direction while being electrically connected to the substrate 11 in the same manner as the front electrode 13. The number of back electrodes 16 having the stripe shape is less than the number of back electrodes 16 having the shape such as the circle, the oval, and the polygon.

The back electrodes 16 collect carriers (for example, holes) moving to the substrate 11 and transfer the carries to the back electrode conductive layers 16'.

A portion of each back electrode 16 contacting the substrate 11 may contain only a formation material of the back electrode conductive layer 16', or may contain a formation material of the passivation layer 19 and a formation material of the substrate 11 as well as the formation material of the back electrode conductive layer 16'.

The back surface field layer 18' between the back electrode 16 and the substrate 11 is a region (e.g., a $p^+$-type region) that is more heavily doped with impurities of the same conductive type as the substrate 11 than the substrate 11.

When the back electrode 16 has the stripe shape that extends in one direction while being electrically connected to the substrate 11 in the same manner as the front electrode 13, the back surface field layer 18' may have the stripe shape in the same manner as the back electrode 16.

The back electrode 16 and the back surface field layer 18' may be formed by forming the back electrode conductive layers 16' on the passivation layer 19, applying a laser beam in a predetermined area to form a molten mixture of the back electrode conductive layers 16', the passivation layer 19, and the substrate 11, and firing the substrate 11 at a temperature of about 750° C. to 800° C.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell panel, comprising:
a plurality of solar cells;
a plurality of interconnectors, each interconnector electrically connecting one of two adjacent solar cells of the plurality of solar cells to the other of the two adjacent solar cells;
a transparent member positioned on light receiving surfaces of the plurality of solar cells; and
a back sheet positioned under back surfaces of the plurality of solar cells,
wherein each solar cell includes:
a substrate;
a plurality of front electrodes extending in a first direction and positioned on a light receiving surface of the substrate;
front electrode current collectors extending in a second direction crossing the first direction and positioned on the light receiving surface of the substrate;
back electrodes extending in a second direction crossing the first direction and positioned on a back surface of the substrate; and
a plurality of stripe-shaped openings extending in the second direction, each of the plurality of stripe-shaped openings disposed between adjacent two back electrodes and exposing the back surface of the substrate, such that the back electrodes are physically disconnected from each other by the plurality of stripe-shaped openings,
wherein the each solar cell lacks back electrode current collectors on the back surface of the substrate exposed by the plurality of stripe-shaped openings.

2. The solar cell panel of claim 1, wherein the each solar cell further comprises a back surface field layer positioned at the back surface of the substrate, and
wherein the back surface field layer is formed in an area of the back surface of the substrate at which the back electrodes are positioned, and in an area of the back surface of the substrate at which the stripe-shaped opening is positioned.

3. The solar cell panel of claim 1, further comprising a plurality of conductive adhesive films respectively positioned between the each solar cell and the interconnector and including a resin and a plurality of conductive particles dispersed in the resin,
wherein each conductive adhesive film and at least one back electrode have substantially the same thickness.

4. The solar cell panel of claim 3, wherein the interconnector and each stripe-shaped opening have substantially the same width.

5. The solar cell panel of claim 3, wherein the interconnector and each stripe-shaped opening have different widths.

6. The solar cell panel of claim 1, further comprising:
a plurality of conductive adhesive films respectively positioned between the each solar cell and the interconnector and including a resin and a plurality of conductive particles dispersed in the resin,
wherein each conductive adhesive film and at least one back electrode have different thicknesses.

7. The solar cell panel of claim 6, wherein the interconnector and each stripe-shaped opening have substantially the same width.

8. The solar cell panel of claim 6, wherein the interconnector and each stripe-shaped opening have different widths.

9. The solar cell panel of claim 6, wherein at least one of the plurality of conductive particles directly contacts at least one of the substrate and the interconnector.

10. The solar cell panel of claim 1, wherein the each solar cell further includes an emitter layer positioned on the light receiving surface of the substrate, and an anti-reflection layer positioned on the emitter layer at a portion on which the plurality of front electrodes are not positioned.

11. The solar cell panel of claim 10, wherein each front electrode current collector is positioned on the emitter layer.

12. The solar cell panel of claim 6, wherein the resin is positioned between the plurality of conductive particles and the substrate and between the plurality of conductive particles and the interconnector.

13. The solar cell panel of claim 12, wherein the plurality of conductive particles are electrically connected to one another.

14. The solar cell panel of claim 12, wherein the each solar cell further includes an emitter layer positioned on the light receiving surface of the substrate and an anti-reflection layer positioned on the emitter layer at a portion on which the plurality of front electrodes are not positioned.

15. The solar cell panel of claim 14, wherein each front electrode current collector is positioned on the emitter layer.

16. The solar cell panel of claim 1, wherein the interconnector has a non-uniform surface and a flat surface opposite the non-uniform surface, the non-uniform surface protruding in a direction away from the flat surface.

17. The solar cell panel of claim 16, wherein a middle portion in the first direction of the non-uniform surface of the interconnector is thicker than lateral edges in the first direction of the interconnector, the first direction being a width direction of the interconnector.

18. The solar cell panel of claim 17, wherein in the one of the two adjacent solar cells, the flat surface of the interconnector faces one front electrode current collector and the non-uniform surface of the interconnector faces the transparent member, and
wherein in the other of the two adjacent solar cells, the non-uniform surface of the interconnector faces one stripe-shaped opening and the flat surface faces the back sheet.

19. The solar cell panel of claim 6, wherein on the back surface of the substrate exposed by the plurality of stripe-shaped openings, only the plurality of conductive adhesive films are directly attached.

* * * * *